United States Patent [19]

Zamborelli

[11] Patent Number: 4,777,326

[45] Date of Patent: Oct. 11, 1988

[54] WOVEN CABLE WITH MULTIPLE LOSSY TRANSMISSION LINES

[75] Inventor: Thomas J. Zamborelli, Colorado Springs, Colo.

[73] Assignee: Hewlett-Packard Company, Palo Alto, Calif.

[21] Appl. No.: 48,165

[22] Filed: May 11, 1987

[51] Int. Cl.$^4$ .......................... H01B 7/34; H01B 7/08
[52] U.S. Cl. ...................................... 174/36; 174/32; 174/115; 174/117 M; 338/208
[58] Field of Search ............... 174/36, 32, 115, 117 M; 338/208, 212, 214; 333/1, 236, 243

[56] References Cited

U.S. PATENT DOCUMENTS

| 272,441 | 2/1883 | Hunter | 174/117 M |
|---|---|---|---|
| 3,654,380 | 4/1972 | Tatum et al. | 174/47 |
| 3,775,552 | 11/1973 | Schumacher | 174/105 R |
| 3,991,397 | 11/1976 | King | 338/214 |
| 4,143,236 | 3/1979 | Ross et al. | 174/117 M X |
| 4,190,319 | 2/1980 | Eggleston | 350/96.23 |
| 4,460,803 | 7/1984 | Piper | 174/117 M X |
| 4,490,690 | 12/1984 | Suzuki | 333/1 |
| 4,527,135 | 7/1985 | Piper | 333/243 X |

FOREIGN PATENT DOCUMENTS

| 647747 | 2/1979 | U.S.S.R. | 174/117 M |
| 1205800 | 9/1970 | United Kingdom | 338/208 |

*Primary Examiner*—Morris H. Nimmo
*Attorney, Agent, or Firm*—Karl E. Bring; Jeffery B. Fromm

[57] ABSTRACT

A modification of a woven cable (wire and fabric woven together to form a flat ribbon cable) assembly, in which the signal wires of the transmission lines are replaced with solderable resistance wires, thereby providing an economical method of building multiple lossy transmission lines.

7 Claims, 4 Drawing Sheets

WOVEN CABLE WITH MULTIPLE LOSSY TRANSMISSION LINES

BACKGROUND OF THE INVENTION

The present invention relates to electrical cables, and particularly to woven electrical cables used for probing applications which require multiple probes, for example, measuring instruments such as analog or digital oscilloscopes or logic analyzers.

Electrical cables are used to transfer electrical signals from one point to another. Three important concerns of electrical cable design are maintaining the integrity of the signals during transfer, maintaining the integrity of the system under test, and withstanding physical manipulation without being bulky, heavy, or difficult to use. One economical method of providing protection from physical impacts and abrasions which is well-known is to encase the electrical cable in a strong, durable, woven cable.

A type of cabling method used in the prior art required the use of a coaxial cable with a resistive center conductor for each signal to be probed. For example, a logic analyzer having 16 probes would require 16 coaxial cables tied together from the logic analyzer to the system under test. This tended to greatly improve the performance of the probing system, since the shielding was greatly improved, bandwidth was increased, and crosstalk was reduced. However, the result was an extremely bulky, costly, and heavy cable, making it difficult for the user to operate with a typical system under test.

A second prior art signal transference system used with a measuring instrument having multiple probes is shown in FIG. 1. This system used resistor-capacitor attenuation circuits for each probe and had a pod 10 containing active electronics located in close proximity to the probe tips 20. The system used a twisted pair cable 90 from the pod 10 to the measuring instrument and used a relatively short single wire 100 (approximately ten inches long) from the pod 10 to the probe tip 20 for each probe. Each probe tip 20 was connectable to the system under test. The pod 10 contained drivers to actively transmit the signals to the measuring instruments on the twisted pair cable 90. The twisted pair cable 90 provided some shielding and avoidance of crosstalk once the signals from the system under test reached the pod 10. Prior to the signals reaching the pod 10, however, crosstalk developed in the wire 100 because the wire 100 and the ground wire 110 formed a lossless transmission line with very little shielding. Also, the probes had a higher input capacitance because the resistor-capacitor attenuation networks were located in the pod and not at the probe tips. This limits the effective bandwidth of the probes because of the resonant circuit formed by the single wire inductance and its stray capacitance.

SUMMARY OF THE INVENTION

In accordance with the illustrated preferred embodiment of the present invention, a cable for use in multiple probing applications is constructed from wire and fabric woven together to form a flat ribbon cable, having resistance wires for signals alternating with standard lossless wires for ground to form a lossy transmission line. This is a cost effective method of building multiple passive probe systems for measuring instruments such as logic analyzers or multi-channel oscilloscopes. In addition, a polytetraflouroethylene (PTFE) (also sold under the trade name "Teflon") jacket covering the resistance wires provides protection against electrostatic discharge and mechanical impacts. In one embodiment, using two conducting wires on each side of each resistance wire for ground return of the signal and shielding to the chassis respectively provides an optimum configuration for maintaining signal and shielding integrity. In a second embodiment, however, using only one conducting wire on each side of each resistive wire still maintains good signal integrity with some loss of shielding while significantly lowering the fabrication cost of the cable and minimizing the width of the cable for a given number of channels.

DETAILED DESCRIPTION OF THE PREFERRED EMBODIMENT

Figure 1:
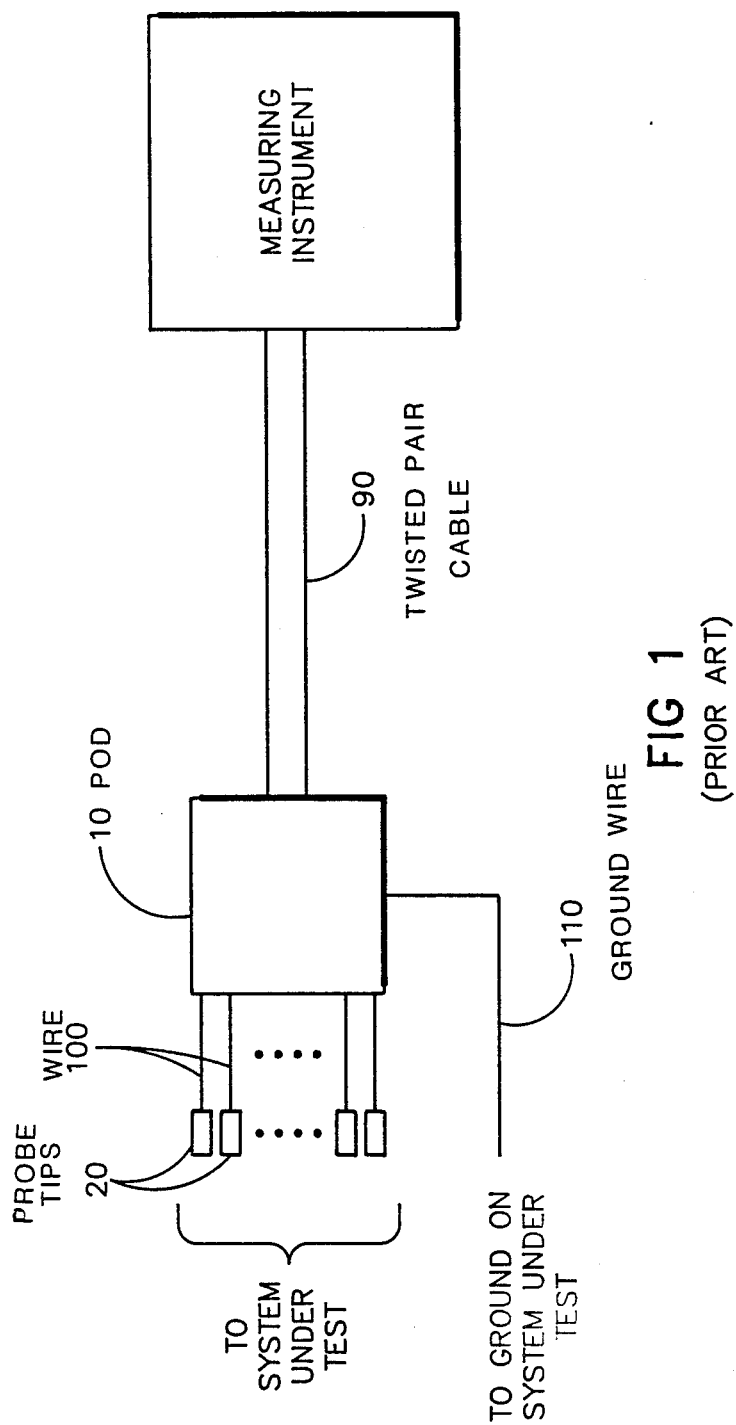
FIG. 1 is a diagram of a prior art probe system using twisted pair cable.
Figure 2:
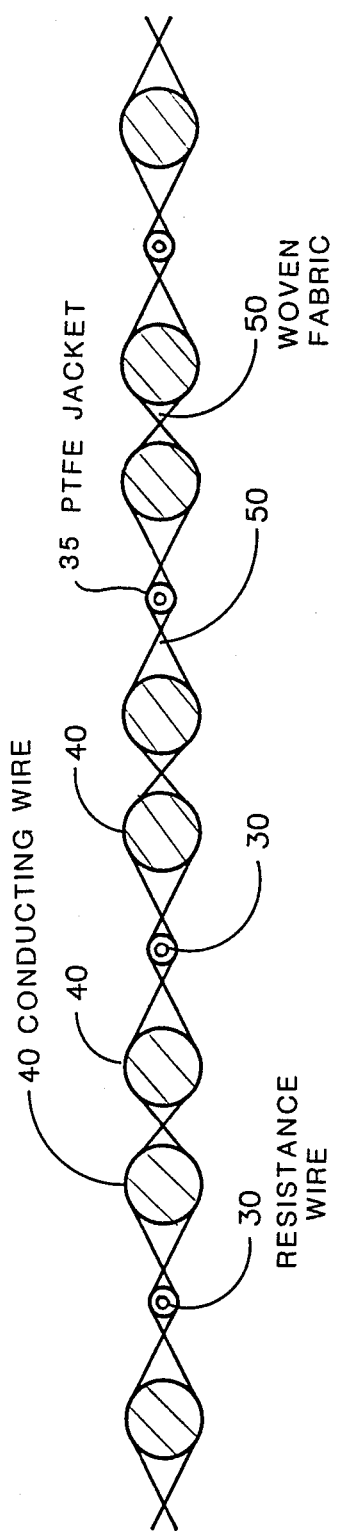
FIG. 2 is an end view of a preferred embodiment of the present invention using 30 gauge wire for grounding in combination with smaller resistance wire for signal transference.

FIG. 2 is an end view of a preferred embodiment of the present invention. Resistance wires 30 are flanked on either side by conducting wires 40, and a woven fabric 50 isolates each wire from the rest of the wires, while still keeping the wires in close proximity with each other. The resistance wires 30 in combination with the conducting wires 40 form a lossy transmission line which damps out reflections occurring in the cable because the cable is not terminated in its characteristic impedance. Crosstalk is reduced because of the improved shielding provided by the conducting wires on either side of the resistive wire and reflections are damped out by the resistive wire, producing a more accurate replication of the signal under test over a wider bandwidth, and yet the cable is lightweight, durable, easily maneuverable, and economical. A bandwidth of 200 MHz was realized for the embodiment shown in FIG. 2.

Any of a number of wires having resistance characteristics could be used with the conducting ground wire to create a lossy transmission line. For example, one wire used in a preferred embodiment of the present invention is an alloy of approximately 55% copper and 45% nickel, has a resistance of approximately 38 ohms per foot, and is sold under the trade name CB Cupron alloy by Carpenter Technology Corporation in Reading, Pa. This wire also works well because it is solderable and therefore easy to terminate. Using this alloy to make a wire which meets with the resistance level specified by the design results in a very fragile wire with a diameter of approximately 0.00275 inch. Consequently, it is desireable to protect the wire from physical impacts and stress.

In the preferred embodiment of the present invention, two methods of protecting the resistance wire are used.

First, the wire is coated with a PTFE jacket 35 to protect the fragile wire from physical impacts and stress. In addition, the PTFE is an appropriate dielectric which tends to provide protection against electrical static discharge. Second, the wire is contained in a very tough, durable, flexible woven fabric which provides additional strength and shielding from physical impacts and stress. One example of a fabric material which meets these criteria is polyester, also sold under the trade name Celanese 500 Denier D-224 and used by Woven Electronics Corp. of Simpsonville, S.C., in their woven cable assembly.

Figure 3:
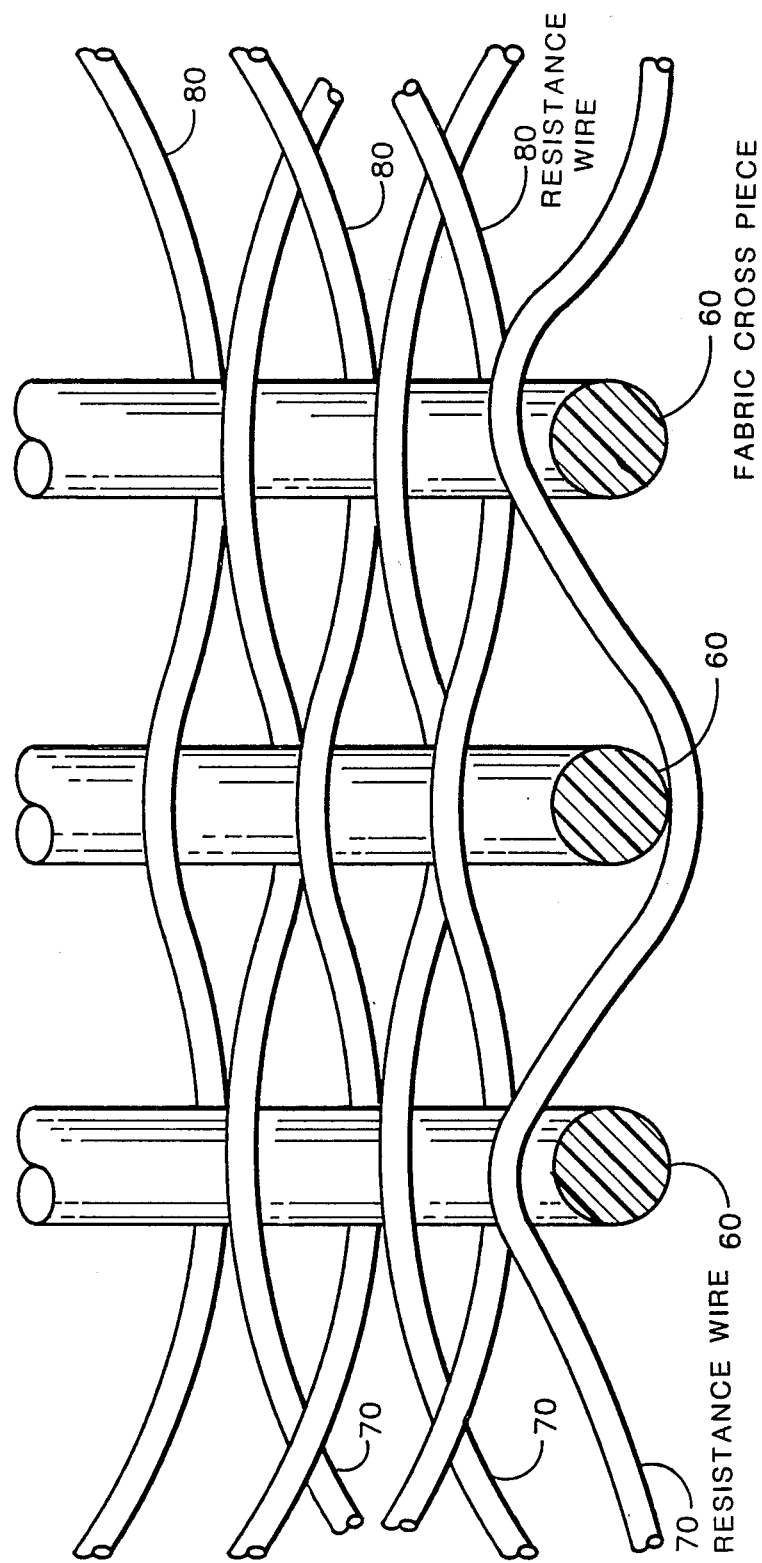
FIG. 3 is a side view of a ribbon cable according to the preferred embodiment of the present invention which illustrates the relationship of the signal wires in the fabric to each other.

It is known that the pattern of weaving may also be used to increase the performance of the cable as shown in FIG. 3. FIG. 3 is a side perspective view of the woven cable according to the preferred embodiment of the present invention. Resistance wires 70 and 80 alternate as to the side of the fabric crosspieces 60 the wires will be on. As resistance wires 70 are located on one side of any given fabric cross-piece of the fabric crosspieces 60, the alternate resistance wires 80 will be located on the other side of the given fabric cross piece. This technique of avoiding parallel wire configurations reduces crosstalk. The ground wires flanking each resistance wire and the remainder of the fabric are not shown.

Figure 4:
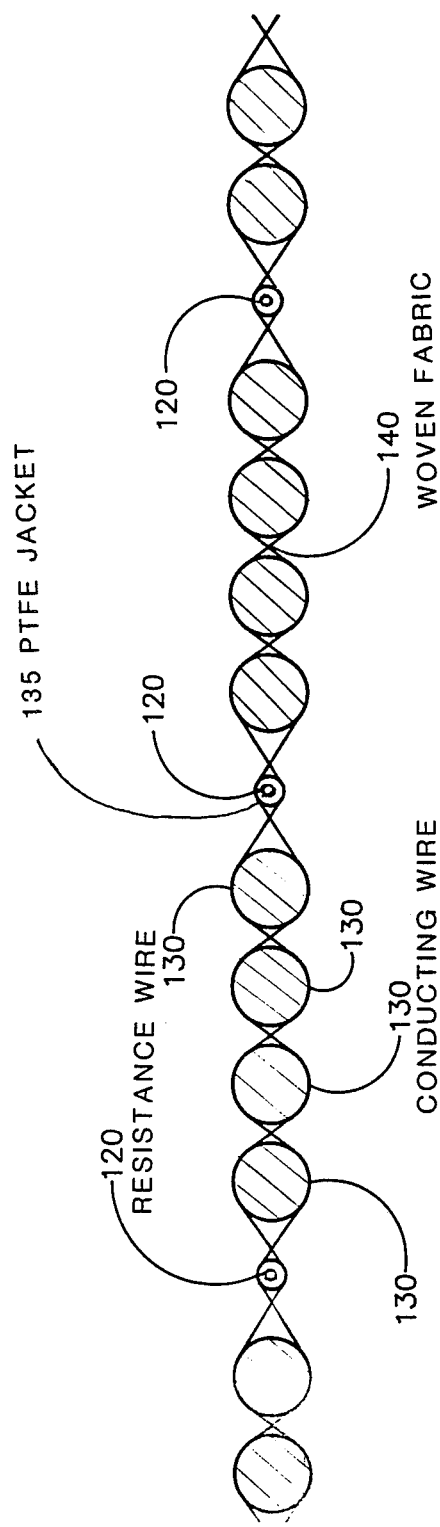
FIG. 4 is an end view of another embodiment of the present invention in which each resistive wire is flanked on either side by two conducting wires.

Another embodiment shown in FIG. 4 provides improved performance over the embodiment shown in FIG. 2, but is more expensive and slightly bulkier. In this embodiment, each resistive wire 120 is flanked on either side by two conducting wires 130 encompassed by PTFE jacket 135. The pair of conducting wires 130 closest to the resistive wires 120 are used for a signal return and the other pair are connected to the earth ground of the measuring system. In a cable for a plurality of probes, four conducting wires 130 appear between each resistive wire 120, as opposed to two conductive wires 40 between each resistive wire 30 in the embodiment illustrated in FIG. 2. The two conducting wires provide good isolation, and the four conducting wires provide good isolation and good shielding integrity. The shielding continues to improve as more conducting wires are added between the resistive wires, but the rate of improvement soon becomes insignificant.

I claim:

1. A woven electrical cable for use with multiple probe systems, comprising:

a plurality of resistive means, each connectable to a measuring instrument and a probe tip for carrying signals from a system under test and for damping out reflections, a plurality of conductive means, each associated with a particular resistive means, connectable to a reference voltage in the system under test and a reference in the measuring instrument for electrically shielding the resistive means, fabric means having a nonconductive nature for isolating each resistive means from the associated conductive means, for maintaining a relatively constant proximity of each resistive means to the associated conductive means, and for protecting all resistive means and all conductive means from physical impacts and abrasions and from electrical static discharge into all resistive means and all conductive means.

2. A woven electrical cable as in claim 1, further comprising:

a plurality of support means coating each resistive means and having a dielectric nature for increasing the strength of each resistive means, and for further protecting each resistive means from physical impacts and abrasions and from electrical static discharge into each resistive means.

3. A woven electrical cable as in claim 1, wherein:

each resistive means is flanked by two conductive means, such that one conductive means is located on one side, and one conductive means is located on the opposite side, and all resistive means and conductive means lie in a plane.

4. A woven electrical cable as in claim 1, wherein:

each resistive means is flanked by four conductive means, such that two conductive means are located on one side, and two conductive means are located on the opposite side, and all resistive means and conductive means lie in a plane.

5. A woven electrical cable as in claim 2, wherein each support means is fabricated from polytetrafluoroethylene.

6. A woven electrical cable as in claim 1, wherein:

each resistive means is flanked by two conductive means, such that one conductive means is located on one side, and one conductive means is located on the opposite side, and the fabric means comprises a woven ribbon cable fabricated from polyester.

7. A woven electrical cable as in claim 1 wherein:

each resistive means is flanked by four conductive means, such that two conductive means are located on one side, and two conductive means are located on the opposite side, and the fabric means comprises a woven ribbon cable fabricated from polyester.

* * * * *